(12) United States Patent
Twitchell (10) Patent No.: US 6,285,412 B1
(45) Date of Patent: Sep. 4, 2001

(54) ADAPTIVE PRE-EQUALIZATION APPARATUS FOR CORRECTING LINEAR DISTORTION OF A NON-IDEAL DATA TRANSMISSION SYSTEM

(75) Inventor: Edwin Ray Twitchell, Quincy, IL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 09/105,824

(22) Filed: Jun. 26, 1998

Related U.S. Application Data (60) Provisional application No. 60/053,482, filed on Jul. 23, 1997.

(51) Int. Cl.[7] ............................................ H04N 5/21
(52) U.S. Cl. .................... 348/608; 348/723; 348/470; 375/297; 333/149
(58) Field of Search ........................ 348/21, 470, 608, 348/723, 725; 375/232, 240.27, 346, 380, 296, 297; 330/149; 714/774

(56) References Cited

U.S. PATENT DOCUMENTS

| | | | |
|---|---|---|---|
| 4,291,277 | 9/1981 | Davis et al. ................... | 330/149 |
| 4,412,337 | 10/1983 | Bickley et al. . | |
| 4,435,823 | 3/1984 | Davis et al. . | |
| 4,700,151 | 10/1987 | Nagata . | |
| 4,947,363 | 8/1990 | Williams . | |
| 5,049,832 | 9/1991 | Cavers . | |
| 5,107,520 | 4/1992 | Karam et al. . | |
| 5,448,206 | 9/1995 | Newhall ....................... | 332/103 |
| 5,489,879 | 2/1996 | English . | |
| 5,590,121 | 12/1996 | Geigel et al. . | |
| 5,732,333 | 3/1998 | Cox et al. . | |
| 5,745,006 | 4/1998 | Budnik et al. . | |
| 5,748,678 | * 5/1998 | Valentine et al. ............. | 375/297 |
| 5,751,766 | * 5/1998 | Kletsky et al. ................ | 375/224 |
| 5,910,965 | * 6/1999 | Ierfino et al. ................. | 375/220 |
| 5,959,500 | * 9/1999 | Garrido ......................... | 330/151 |
| 6,054,895 | * 4/2000 | Danielsons ................... | 330/149 |
| 6,075,411 | * 6/2000 | Briffa et al. .................. | 330/149 |
| 6,104,241 | * 8/2000 | Cova et al. ................... | 330/149 |

OTHER PUBLICATIONS

Wright Andrew S; Durtler William G: "Experimental Performance of an Adaptive Digital Linearized Power Amplifier" IEEE MTT–S International Microwave Symposium Digest, vol. 2, Jun. 1–5, 1992, pp. 1105–1108, XP000343487 Albuquerque, NM, USA.

Saleh A A M et al: "Adaptive Linearization of Power Amplifiers in Digital Radio Systems " Bell System Technical Journal, vol. 62, No. 4, Part 01, Apr. 1983, pp. 1019–1033, XP002028354.

* cited by examiner

*Primary Examiner*—Victor R. Kostak
(74) *Attorney, Agent, or Firm*—Tarolli, Sundheim, Covell, Tummino & Szabo L.L.P.

(57) ABSTRACT

An adaptive apparatus (10) for compensating a linear distorting action to an information signal within a non-ideal transmission system (12). Within the system (12), an information signal proceeds to a transmitter (34) that has an amplifier (62). A sample signal is coupled-off from the transmitter (34). The linear distorting action of the system (12) includes shifting of at least one aspect of the signal away from its intended value. A linear pre-equalizer (54), located along a signal stream of the information signal to the transmitter (34), pre-equalizes the information signal. An adaptive equalization determination (70), connected to receive the sample signal and the information signal outside of the signal stream to the transmitter (34), determines an amount of pre-equalization required from the linear pre-equalizer (54) to compensate the linear distorting action of the system (12). The pre-equalization by the linear pre-equalizer (54) is modified in response to the determination by the adaptive equalization determination (70).

21 Claims, 3 Drawing Sheets

ADAPTIVE PRE-EQUALIZATION APPARATUS FOR CORRECTING LINEAR DISTORTION OF A NON-IDEAL DATA TRANSMISSION SYSTEM

RELATED APPLICATION

This application claims benefit of U.S. Provisional Application No. 60/053,482,filed Jul. 23, 1997.

TECHNICAL FIELD

The present invention relates to communication systems and is particularly directed to a system for compensating linear distortion caused by any high speed linear data system, and specifically a digital TV ("DTV") transmission system.

BACKGROUND OF THE INVENTION

A high-speed data communication system such as a DTV broadcast communication system requires linear equalization for optimum performance and signal coverage. Because of the high data rates required in a DTV system, an adaptive equalization system becomes very difficult to implement using known equalization techniques.

Traditional linear equalization (compensation) for television systems has been accomplished by analog, pre-distortion equalizers which are static (non-adaptive). These equalizers are filters/correctors that require factory adjustments to provide a desired amount of pre-distortion (pre-equalization). Aging of the filters/correctors and temperature change cause drift in the amount of pre-distortion. Occasional field adjustments are required.

Digital signal processing techniques provide improved performance of the pre-equalization of the information signal. Specifically, digital signal processing can be used in an adaptive correction and equalization approach. Such an adaptive approach can eliminate the factory and field adjustments.

It is known to perform adaptive correction of a signal within a signal stream proceeding toward a transmitter. However, in a relatively fast data rate system, the correction requires a relatively large amount of processing in a short period of time. For example, assuming a 64 tap Finite Impulse Response ("FIR") filter, processing a DTV signal at a 25 Mhz sample rate, the update of the filter requires 64 times 25 million updates per second. This translates to 1.6 billion updates per second. Such an update rate requires that the adaptation process be done offline.

SUMMARY OF THE INVENTION

In accordance with one aspect, the present invention provides an adaptive apparatus for compensating a linear distorting action to an information signal within a non-ideal transmission system. The system includes signal provision means for providing an information signal, and also includes output means. The linear distorting action of the system includes shifting of at least one signal aspect of the signal away from its intended value. In one example, the transmission system is a high-speed data system, and is particularly a DTV broadcast transmission system. In the DTV transmission system, band limiting filters and other system impairments distort signal aspects away from their intended values. The apparatus includes compensator means, located along a signal stream from the signal provision means to the output means, for pre-equalizing the information signal. Sampler means couples off a sample signal from the output means. Determination means, connected to receive the sample signal and the information signal outside of the signal stream from the signal provision means to the output means, determines an amount of pre-equalization by the compensator means to compensate the linear distorting action of the system. Means modifies the pre-equalization caused by the compensator means in response to the determination by the determination means.

In accordance with another aspect, the present invention provides a digital adaptive equalizer circuit for correcting the frequency response of a transmission system. The system includes an output stage with an input digital-to-analog converter circuit for converting digital signals into analog form for transmission as analog signals, and includes a feedback circuit with an analog-to-digital converter for receiving and converting the transmitted output analog signals to digital form. The digital adaptive equalizer circuit includes a first input circuit, with an input memory circuit, for receiving the input digital signals to be transmitted by the transmission system. The digital adaptive equalizer circuit includes a second input circuit, with a feedback memory circuit, for receiving the output signals in digital form from the feedback circuit. A first adaptive digital corrector circuit, having a variable frequency response that is varied by digital signals applied thereto, receives the input digital signals from the first input circuit, modifies the frequency response of the input digital signals, and applies the modified input digital signals to the output stage for transmission. A second adaptive digital corrector circuit, having a variable frequency response that is varied by digital signals applied thereto, receives output digital signals from the feedback memory circuit and modifies the frequency response of the received output digital signals. A comparison circuit compares the input digital signals from the input memory circuit to the output digital signals from the second adaptive corrector filter and applies digital difference signals to the second adaptive digital corrector circuit for controlling the degree of modification applied by the second adaptive digital corrector circuit to the received output digital signals in a direction so as to reduce the difference between the digital input signals and the digital output signals. A control circuit applies digital signals to the first adaptive digital corrector for correcting the first adaptive corrector circuit to the second corrector circuit.

In accordance with another aspect, the present invention provides a digital television broadcast transmitter. The transmitter includes an analog power amplifier circuit. An exciter circuit receives digital television signals and formats the digital television signals in form to be broadcasted by the transmitter. A digital-to-analog converter circuit converts the formatted digital televisions into analog form for application to the power amplifier circuit. A feedback circuit receives output analog television signals from the power amplifier circuit and includes a digital-to-analog converter circuit for converting the output analog television signals into digital form. A first adaptive digital corrector circuit receives the formatted input digital television signals, modifies the formatted input digital television signals, and applies the modified formatted input digital television signals to the digital-to-analog converter circuit. A control circuit includes a second adaptive digital corrector circuit receiving digital output signals from the feedback circuit. The control circuit includes a comparison circuit for comparing the formatted input digital television signals to corresponding modified output digital television signals from the second adaptive digital corrector circuit and applying digital control signals to the second adaptive digital corrector circuit for controlling the degree of modification applied to the received output digital television signals in a direction so as to reduce the difference between the formatted input digital television signals and the digital output television signals. The control circuit also includes a circuit for correlating the modification applied by the first adaptive corrector circuit as a function of the modification applied by the second adaptive corrector circuit.

In accordance with another aspect, the present invention provides a digital adaptive equalizer circuit for modifying input digital signals to be applied to a transmission system that includes an output stage and a feedback circuit for providing output signals from the output stage in digital form. The digital adaptive equalizer circuit includes a first adaptive digital equalizer for receiving the input digital signals and modifying the input digital signals and applying the modified input digital signals to the output stage for transmission. The digital adaptive equalizer circuit includes a control circuit. The control circuit includes a second adaptive digital equalizer receiving digital output signals from the feedback circuit. The control circuit includes a comparison circuit for comparing the input digital signals to corresponding modified output digital signals from the second adaptive equalizer for controlling the degree of modification applied by the second adaptive equalizer to the received output digital television signals in a direction so as to reduce the difference between the input digital signals and the digital output signals. The control circuit includes a circuit for correlating the modification applied by the first adaptive equalizer as a function of the modification applied by the second adaptive equalizer.

In accordance with another aspect, the present invention provides, in a digital television broadcast transmitter that has an input circuit for receiving digital television input signals and formatting the digital television signals in form for broadcasting, and a digital-to-analog converter for converting the formatted digital television signals into analog form for transmission by the transmitter power amplifier stage, a method for correcting distortions in the transmitter output analog television signals. The analog television signals output from the power amplifier stage are received and converted into digital form. The output digital television signals are modified offline. The formatted input digital television signals are received and compared with the corresponding offline modified output digital television signals to control the offline modification of the output digital television signals in a direction to reduce the difference between the formatted input digital television signals and the output digital television signals. The received formatted input digital television signals are modified online as a function of the offline modification. The online modified formatted input digital television signals are applied to the digital to analog converter.

BRIEF DESCRIPTION OF THE DRAWINGS

The foregoing and other features of the invention will become more apparent upon a consideration of the following description taken in connection with the accompanying drawings, wherein.

DESCRIPTION OF PREFERRED EMBODIMENT

Figure 1:
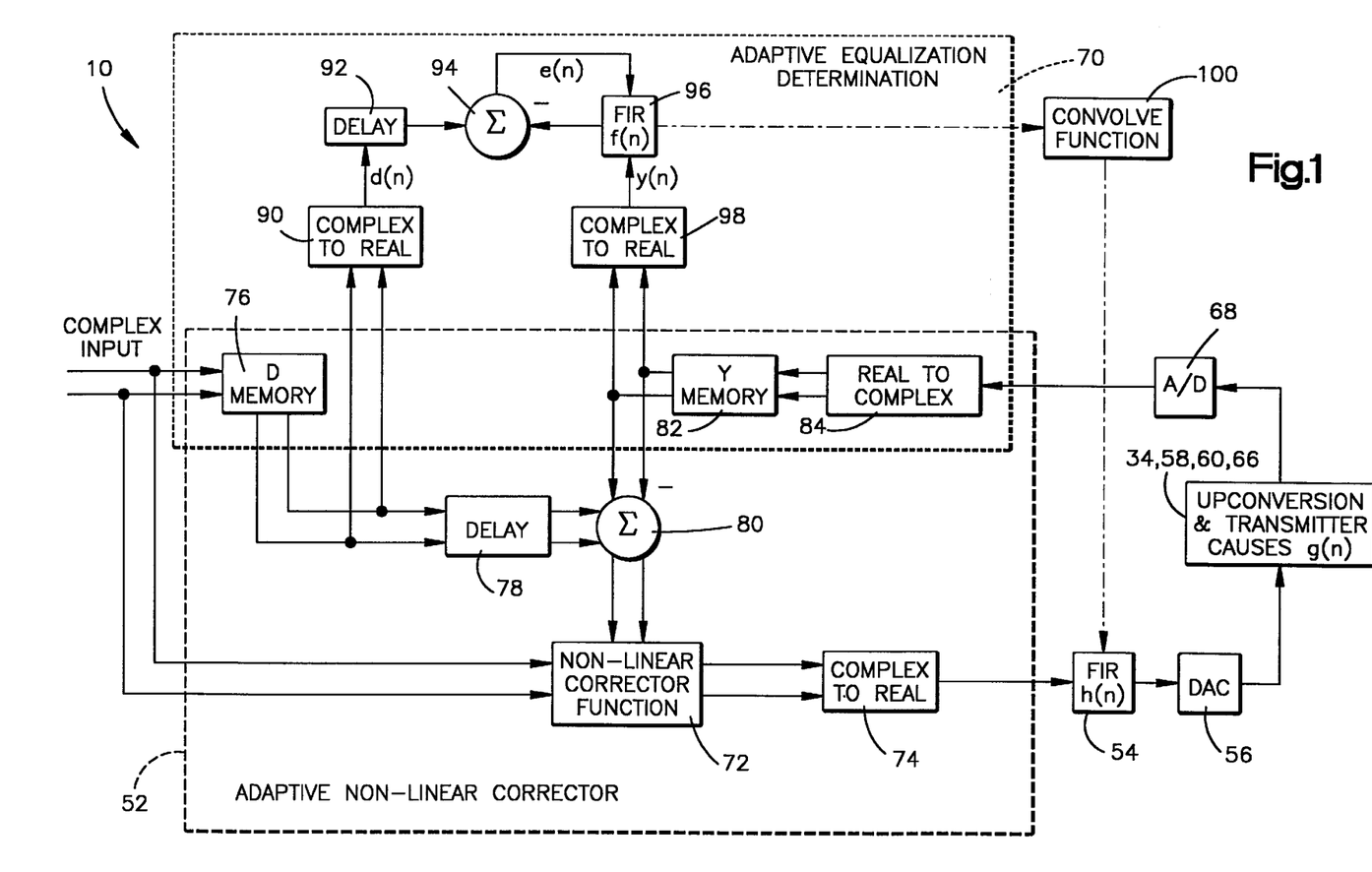
FIG. 1 is a schematic illustration of an apparatus in accordance with the present invention.

One representation of the present invention is schematically shown in FIG. 1 as an apparatus 10 that compensates for distortion of information data signals. The apparatus 10 accordingly to the present invention provides pre-equalization "compensation" for information data, which is transmitted at a relatively high rate. Further, the present invention is useful for wide band applications (e.g., 18 MHz).

Figure 2:
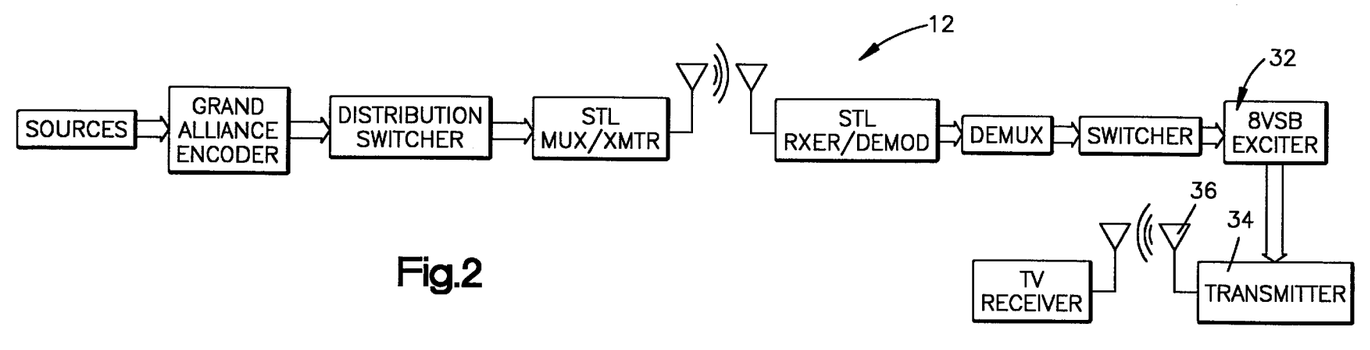
FIG. 2 is a schematic illustration of an example device in which the present invention is utilized.

The high data rate and bandwidth are related to the system environment in which the apparatus 10 is utilized. Accordingly, the apparatus 10 of the present invention may be used in any system having such demanding requirements. For example, the apparatus 10 is utilized in a high definition ("HD") digital television ("DTV") system 12, as shown in FIG. 2. In pertinent part, the DTV system 12 includes an 8VSB exciter 32. The 8VSB exciter 32 (FIG. 3) contains the apparatus 10 in accordance with the present invention.

Within the system 12, the output of the 8VSB exciter 32 is provided to a transmitter 34 (e.g., UHF and/or VHF). In turn, a broadcast signal from a broadcast antenna 36 is received at a television. A person of ordinary skill in the art will appreciate the general operation and flow of signals through the system 12. Thus, a discussion of the overall operation of the DTV system 12 is omitted for brevity. Further, the person of ordinary skill in the art will appreciate that signal timing lines, which supply appropriate timing signals, to various components of the system (including components of the apparatus 10) are needed for synchronizing operation of the various components. The person of ordinary skill in the art will understand the timing operation. Accordingly, the timing lines are omitted for clarity.

Figure 3:
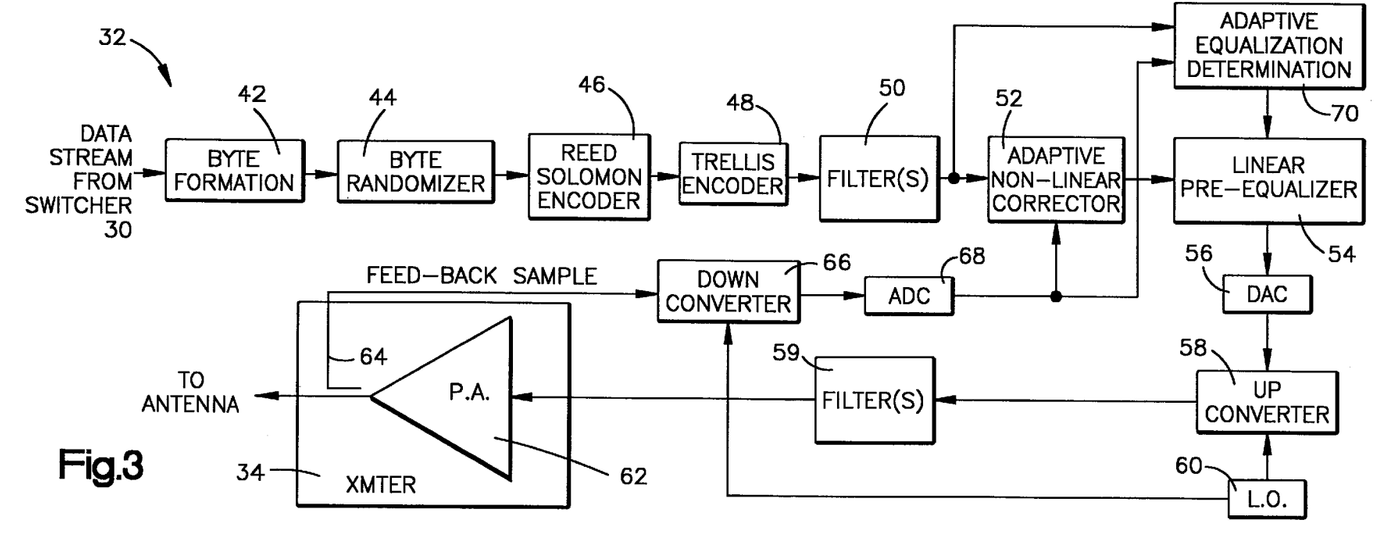
FIG. 3 is a schematic illustration of a portion of the device shown in FIG. 2, which contains the apparatus of the present invention.

Turning now to the details of the sample 8VSB exciter 32 shown in FIG. 3, an information data stream is received (e.g., from a switcher) and proceeds to a byte formation device 42 and then to a byte randomizer device 44. The information data stream proceeds through a Reed Solomon encoder 46 and through a Trellis encoder 48. The information data stream proceeds through one or more filters 50, an adaptive non-linear corrector 52, and a linear pre-equalizer 54. In the preferred embodiment, the information data stream input into the linear pre-equalizer 54 is comprised of 32 byte words defined within a phase amplitude modulated electrical signal.

The linear pre-equalizer 54 is a Finite Impulse Response ("FIR") digital filter, which pre-compensates or pre-equalizes the information signal such that the output from the transmitter 34 is as desired (i.e., no linear distortion). The linear pre-equalizer 54 may be comprised of, or include, a microprocessor that performs a program process and/or may be comprised of, or include, discrete "hard-wired" circuitry. The linear pre-equalizer 54 is part of the apparatus 10, which compensates for linear distortion of the information signal, and is described in greater detail below.

The information data stream proceeds through a digital-to-analog converter (DAC) 56 and an up converter 58, which is driven by a local oscillator 60. The information data stream proceeds from the up converter 58 through various band-limiting filters 59 toward the transmitter 34. Within the transmitter 34, the information data stream (now analog and up-converted) is passed through a high-power transmission amplifier 62 of the transmitter 34. Various band-limiting circuits such as matching networks, input/output filters, and antenna miss-matches distort the information signal passing through the transmitter 34 in both a non-linear and linear fashion. In other words, the system 12 is a non-ideal system.

As part of the process of compensating for both the non-linear and linear distortion caused by the amplifier 62 and other components, the output of the transmitter 34 is sampled to provide a feedback sample signal. The feedback sample signal is indicative of the transmitter output and is provided along a feedback path. Specifically, a coupler 64 couples off the sample signal from the output of the transmitter 34. The feedback sample signal passes through a down converter 66, which is driven by the same local oscillator 60 as the up converter 58 (synchronous demodulation). The feedback sample signal passes through an analog-to-digital (A/D) converter 68 and is provided to the adaptive non-linear corrector 52 for its non-linear correction and also to an adaptive equalization determination 70.

The adaptive equalization determination 70 is part of the apparatus 10. Another input to the adaptive equalization determination 70 is the information data signal. Preferably, the information signal is provided to the adaptive equalization determination 70 from a point on the data stream prior to all pre-correction/pre-equalization (i.e., prior to both the non-linear corrector 52 and the linear pre-equalizer 54). Within the adaptive equalization determination 70, the feedback sample signal and the information data signal are used to determine the amount of linear pre-equalization that the linear pre-equalizer 54 must impose upon the information signal such that the output of the transmitter 34 provides a proper, linearly correct signal. The adaptive equalization determination 70 may be comprised of, or include, a microcomputer and/or discrete circuitry.

With reference to FIG. 1, the data stream is better understood. Specifically, in FIG. 1, the data stream is illustrated as being a complex input which is supplied to a non-linear corrector function 72 within the adaptive non-linear corrector 52. The output of the non-linear corrector function 72 is provided to a complex-to-real converter 74. The output of the complex-to-real converter 74 is provided to the linear pre-equalizer 54. The output of the linear pre-equalizer 54 is provided as the input to the DAC 56.

As shown in FIG. 1, the information signal is "branched-off" of the data stream for use both in non-linear correction and linear equalization. The "branch-off" is off or away from the data stream. Components and activities that are present along the data stream (e.g., 72, 74, 54, 56, etc.) are online. Thus, the "branch-off" permits offline activity. Specifically, the information signal is "branched-off" and provided as an input to a "D" (desired) memory 76. The D memory 76 holds the information signal as a desired result for purposes to be described below. The output of the D memory 76 is provided to a delay 78 within the non-linear corrector 52. The output from the D memory 76 is also provided as a first input to a subtraction device 80 (e.g., a summation device having one additive input and one subtractive input).

The subtraction device 80 receives a second input from a "Y" (return) memory 82. The Y memory 82 is located along the feedback path. Specifically, the Y memory 82 receives an output from a real-to-complex converter 84, which, in turn, receives its input from the A/D converter 68. The Y memory 82 contains the information as it is output from the power amplifier 62. The output of the amplifier 62 is the result of pre-distortion (e.g., pre-correction/pre-equalization) by the non-linear corrector 52 and linear pre-equalizer 54 (described below), and distortion by the non-ideal system 12 that includes the transmitter 34. The subtraction device 80 is a means to compare the desired signal with the actual output signal, and the result of such a comparison is used by the non-linear corrector function 72 to determine a non-linear pre-distortion of the information signal.

Attention is now focused upon the adaptive equalization determination 70, which is used to control the amount of linear pre-equalization imposed on the information signal by the linear pre-equalizer 54. It should be noted that FIG. 1 illustrates certain of the components in the "correction path steam" (i.e., outside of the information stream) as being shared by both the adaptive equalization determination 70 and the adaptive non-linear corrector 52. It is to be appreciated by a person of ordinary skill in the art that other configurations are possible such that components are not shared, etc.

Within the adaptive equalization determination 70, the output of the D memory 76 is provided to a complex-to-real converter 90. The output of the complex-to-real converter 90 is provided to a delay 92, and the output of the delay 92 is provided to a subtraction device 94 (e.g., a summation having a positive input and a negative input). Also, within the adaptive equalization determination 70, the output of the Y memory 82 is provided to a complex-to-real converter 98 and the output of the complex-to-real converter 98 is provided to an adaptive post-equalizer or filter 96. The adaptive filter 96 is similar to the linear pre-equalizer 54 (i.e., both are finite impulse response or "FIR" filters). The adaptive filter 96 may be comprised of, or include, a microprocessor that performs a program process and/or may be comprised of, or include, discrete "hard-wired" circuitry. The output of the adaptive filter 96 is provided as a second input to the subtraction device 94. The subtraction device 94 is a means to compare the two input signals. The output of the subtraction device 94 is fed back into the adaptive filter 96.

The subtraction device 94 and the adaptive filter 96 act as an adaptive post-equalizer for generating a linear pre-equalization value, which is used to compensate for the linear distortion caused by the non-ideal components, e.g., the transmitter 34. It is to be note that any one of a number of adaptive algorithms could be used within the adaptive filter 96. One example algorithm is a least-means-square "LMS" algorithm.

Focusing now on the subtraction device 94, an error value is output from the subtraction device and is derived from the two inputs (i.e., the output from the adaptive filter 96 is subtracted from the delayed, desired signal). Specifically:

$$e(n) = d(n) - y(n) * f(n)$$

wherein:

$e(n)$ is the error;

$d(n)$ is the desired vector (i.e., from the D memory and suitably delayed via delay 92);

$y(n)$ is the return or result signal (i.e., from the Y memory);

$f(n)$ is the correction provided by the adaptive filter 96; and

* is the symbol for convolving (e.g., multiplication of two frequency responses together).

It can be shown that:

$$y(n) = d(n) * g(n) * h(n)$$

wherein:

$g(n)$ is the effect of the non-ideal system (e.g., the transmitter 34); and h(n) is the correction provided by the linear pre-equalizer 54 (in the information stream).
Thus:

$$e(n) = d(n) - d(n)*g(n)*h(n)*f(n)$$

When the error is zero, then:

$$d(n) = d(n)*g(n)*h(n)*f(n)$$

$$g(n)*h(n)*f(n) = \gamma(n)$$

Accordingly:

$$h(n)*f(n) = g^{-1}(n)$$

The example LMS algorithm is:

$$f(n) = h(n) + \beta(e(n)*x(n))$$

wherein:
  $\beta$ is a scaling factor.

From the above equations it is seen that the convolving of the linear pre-equalizer 54 and the adaptive filter 96 provides the inverse of the system effect and thus provides the optimum pre-equalization. Thus, in accordance with the present invention, the values of the adaptive filter 96 are convolved with those of the linear pre-equalizer 54. The values that result from the convolution are then stored for use by the linear pre-equalizer 54. For example, in a digital filter having a plurality of taps (e.g., 32) the tap values are modified (e.g., updated). The means 100 for convolution of the values from the adaptive filter 96 to those of the linear pre-equalizer 54 is represented in FIG. 1 by the dot-dash line connecting the linear pre-equalizer 54 and the adaptive filter 96 and a schematic convolve function block. The structure for performing the convolution function 100 may include a microprocessor performing a program and/or discrete "hard wired" circuitry.

It should be appreciated that the adaptive equalization determination 70, with its adaptive filter 96, is outside of the information stream heading toward the transmitter 34 (i.e., offline). The operation of the adaptive equalization determination 70, with its adaptive filter 96, can, and does, occur at a rate that is independent of the rate of operation of the linear pre-equalizer 54 (e.g., not lock-stepped). Further, the adaptive filter 96 can, and does, continuously operate to develop the equalization, except during a convolution with the pre-equalizer 54.

The post-equalization is eventually provided to the linear pre-equalizer 54, as will be described below. However, at this point it should be noted that the linear pre-equalizer 54 does not change the amount of linear pre-equalization (i.e., correction) until necessary. For example, the linear pre-equalizer 54 operates to impose a predetermined pre-equalization until it is determined, via the feedback sample signal, that the amount of pre-equalization is no longer effective to compensate for the linear distorting propensities of the non-ideal transmitter 34. Thus, the linear pre-equalizer 54 does not continuously update.

Focusing now upon the update to the linear pre-equalizer 54, when it is determined that the post-equalization, as determined by the operation of the adaptive filter 96, is suitable for use in the information data stream, the filter 96 is convolved with the linear pre-equalizer 54. In other words, convolving the adaptive filter 96 and the pre-equalizer occurs at a suitable time. One example of when to convolve the adaptive filter 96 and the linear pre-equalizer 54 occurs when the error e(n) (the output of subtraction device 94) converges to zero. This occurs when the function of the adaptive filter 96 becomes an impulse response. The function of the adaptive filter 96 is routinely tested to determine whether the function has reached an impulse response status. As an alternative, the convolving can occur when the error is sufficiently small (i.e., the function of the adaptive filter 96 is nearly an impulse response). As yet another alternative, the convolving can occur for each predetermined number of updates. Thus, the convolution is less than continuous.

When it is determined to convolve the adaptive filter 96 and the linear pre-equalizer 54, the filter 96, which has been continuously updating a correction value, is convolved with the linear pre-equalizer 54. The result of the convolving is that the amount of pre-equalization, which will be imposed by the linear pre-equalizer 54, is updated to the new value. This has the advantage that the linear pre-equalizer 54 does not need to continuously operate to update the amount of pre-equalization correction. This is important because the linear pre-equalizer 54 is within the information data stream. The adaptive filter 96, which is outside of the information data stream, provides this function. If the linear pre-equalizer 54 were updated after every sample or very often as in traditional equalizers, then the data contained in the Y memory 82 would be obsolete (i.e., unusable) and data from the Y memory would need to be re-acquired after every update. By having the adaptive filter 96 (post-equalizer) perform the adaptation of the equalization (compensation) values, the data in the Y memory 82 maintains validity, and multiple updates can occur based on the current Y memory data.

When the data is exhausted in the Y memory 82, then the adaptive filter 96 (post-equalizer) can be convolved with the linear pre-equalizer 54. After the convolving, new Y memory data is taken. This has the advantage that the error signal (e(n)) is always a function of the current system (i.e., includes the current pre-equalization imposed by the linear pre-equalizer 54). Also, the adaptive filter 96 can continuously be processing data, except when involved in a convolution with the linear pre-equalizer 54. The capacity of the linear pre-equalizer 54 can be focused upon processing the data stream, except for the relatively infrequent diversion for convolution.

Figure 4:
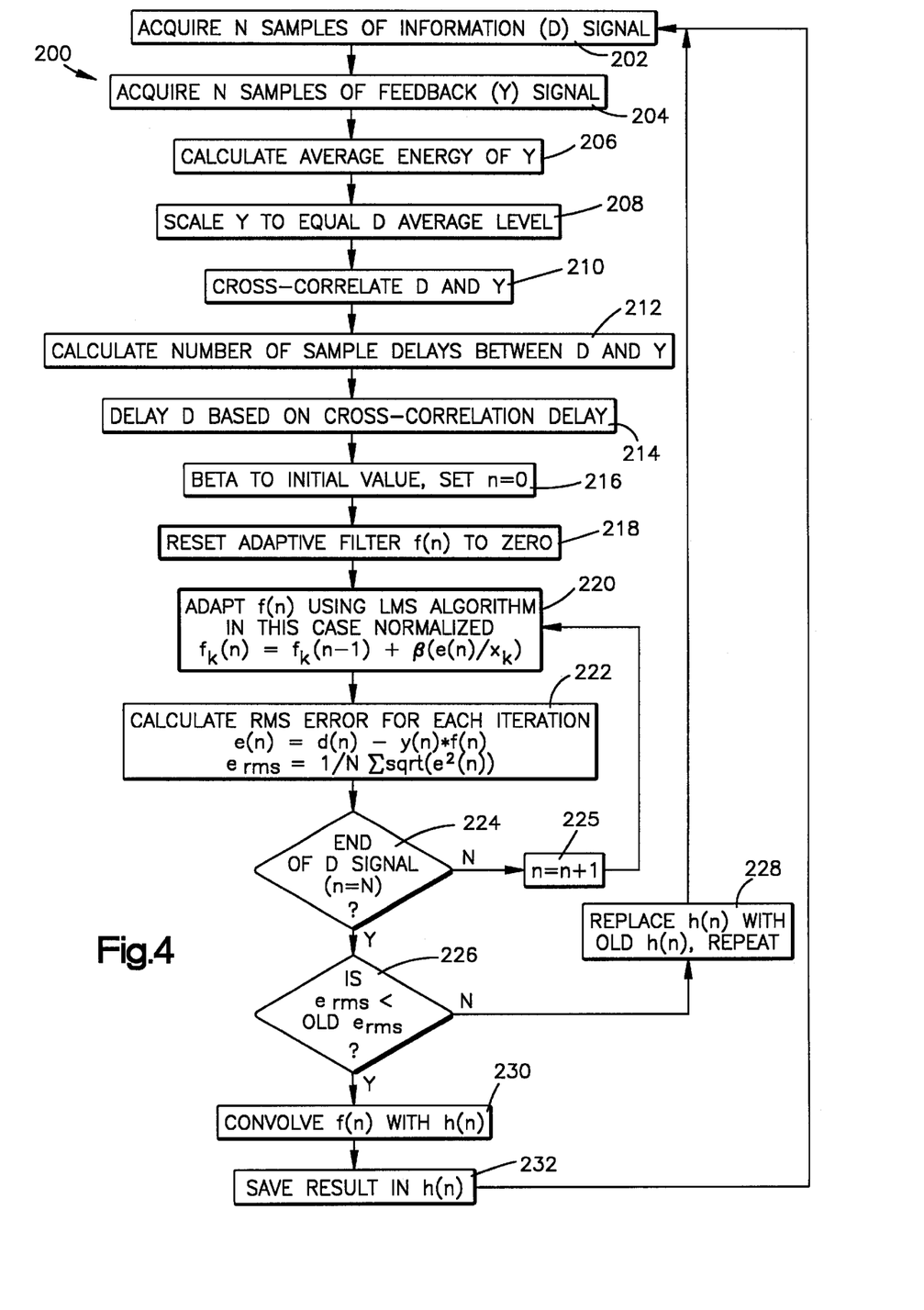
FIG. 4 is a flowchart of a process in accordance with the present invention.

An example of a process 200 for deriving an adaptation for the linear pre-equalizer 54 and proceeding with a convolution to adapt, in accordance with the present invention, is shown in FIG. 4. It should be noted that the process 200 may include other preliminary step(s) such as initialization step(s). Also, the process 200 may include other, minor steps such as storing appropriate values to a memory device.

The process 200 begins a step 202, wherein the adaptive equalizer determination 70 acquires the information signal (i.e., the desired signal values d(n) from the D memory). Specifically, for a system having FIR's with N filter taps, "N" samples are acquired. At step 204, the feedback signal (i.e., the signal values y(n) from the Y memory) is acquired. Again, "N" samples are acquired. The information signal and the feedback signal are referred to in FIG. 4 by "D" and "Y", respectively, for shorthand purposes. The average energy of the feedback signal is calculated at step 206. If desired, the average energy of the information signal is also calculated at step 206. The feedback signal is scaled to equal an average of the information signal (step 208) and the two signals are cross-correlated (step 210).

Specifically, the average energy of the feedback signal can be determined by:

$$y_{rms} = \frac{1}{n}\sum_{k=0}^{n} \sqrt{y^2(k)}$$

The average energy of the information signal can be determined by:

$$D_{rms} = \frac{1}{N}\sum_{k=0}^{N} \sqrt{d^2(k)}$$

The scaling of the feedback signal can be accomplished by:

$$y(n) = \frac{D_{rms}}{Y_{rms}} y(n) \text{ for } n = D \ldots N$$

The cross-correlation is determined by:

$$\phi_{dy}(n) = \sum_{k=-m}^{m} d(k)y(n-k)$$

At step 212, the number of sample delays between the information signal and the feedback signal is calculated. The delay 92 is set based upon the cross-correlation delay calculation at step 214.

The delay "$\Delta$" is determined based upon the following rule:

If $\emptyset_{dy}(n) > \emptyset_{dy}(n-1)$, then $\Delta = n$, for $n=1 \ldots N$ and the delay to the information signal is imposed as:
$d(n)=d(n+\Delta)$ for $n=0 \ldots (N-\Delta)$ At step 216, the scaling factor $\beta$ is set to an initial value (i.e., $\beta=\beta_0$, n=0). At step 218, the adaptive filter 96 has its values set to zero (i.e., f(k)=0, for k=0 . . . M filter taps).

The adaptive filter 96, at step 220, begins an adaptive process using the value e(n) from the subtraction device 94. Preferably, an LMS algorithm is used, and the values are normalized. For example:

$$f_k(n) = f_k(n-1) + \beta(e(n)/x_k)$$

The process 200 proceeds to step 222, wherein the root-mean-square error is calculated for each iteration. Specifically:

$$e(n) = d(n) - y(n) * f(n)$$

$$e_{rms} = \frac{1}{N}\sum \sqrt{e^2(n)}$$

At step 224, it is queried whether the end of the information signal has been reached (i.e., it is queried if the value of m has reached the value of N). If the determination at step 224 is negative (the end has not yet been reached, in other words n is less than N), the process 200 goes to step 225, where 1 is added to the value of n. From step 225, the process 200 goes to step 220. If the determination at step 224 is affirmative, the process 200 goes to step 226. At step 226, it is queried whether the current value of $e_{rms}$ is less than a previously stored value (e.g., old $e_{rms}$). If the determination at step 226 is negative (e.g., the current $e_{rms}$ is not less than old $e_{rms}$), the process 200 goes to step 228, in which the values associated with h(n) (i.e., the pre-equalizer values) are replaced with the same values of h(n) such that the adaptation and error determination can be repeated. Upon completion of step 228, the process loops back to step 202.

If the determination at step 226 is affirmative (e.g., the current $e_{rms}$ is less than old $e_{rms}$), the process 200 goes to step 230. The values for f(n) from the additive filter 96 are convolved with the values h(n) of the linear pre-equalizer 54. The equation is:

$$h'(n) = \sum_{k=-m}^{m} h(k)f(n-k)$$

At step 232, the new values resulting from the convolution are saved to the linear pre-equalizer 54 for use to pre-distort the information signal until such a time that the values are against modified. Specifically, the filter taps are updated as follows:

$$h(n) = h'(n), \text{ for } n = \frac{M}{4} \ldots \frac{3M}{4}$$

Once, the linear pre-equalizer 54 is modified at step 232, the process 200 loops back to step 202.

In one preferred embodiment, the steps 202–228, inclusive are preformed by the adaptive equalization determination 70, with its adaptive filter 96. The step 230 is performed by the convolve function 100. The step 232 is preformed by the linear pre-equalizer 54.

From the above description of the invention, those skilled in the art will perceive improvements, changes and modifications. For example, the most or all of the functions (e.g., the linear pre-equalization, the adaptation, and the convolution) of the apparatus 10 may be performed via a single processor or several cooperating processors. Such improvements, changes and modifications within the skill in the art are intended to be covered by the following claims.

Having described the invention, the following is claimed:

1. An adaptive apparatus for compensating a linear distorting action to an information signal within a non-ideal transmission system, the system including signal provision means for providing an information signal, and also including output means, the linear distorting action of the system including shifting of at least one aspect of the signal away from its intended value, said apparatus comprising:

compensator means, located along a signal stream of the information signal from the signal provision means to the output means, for pre-equalizing the information signal;

sampler means for coupling off a sample signal from the output means;

determination means, connected to receive the sample signal and the information signal outside of the signal stream from the signal provision means to the output means, for determining an amount of pre-equalization required from said compensator means to compensate the linear distorting action of the system; and means for modifying the pre-equalization caused by said compensator means in response to the determination by said determination means.

2. An apparatus as set forth in claim 1, wherein said compensator means includes a linear pre-equalizer for compensating linear distortion caused by the non-ideal system.

3. An apparatus as set forth in claim 1, wherein said determination means functions to continuously determine an amount of pre-equalization, and said means for modifying functions to modify the pre-equalization less than continuously.

4. An apparatus as set forth in claim 3, wherein said means for modifying functions to modify the pre-equalization only after said equalization determination means correctly determines a new amount of pre-equalization.

5. An apparatus as set forth in claim 1 including means for delaying the information signal connected to said determination means such that the information signal supplied to said determination means correlates with the sample signal supplied to said determination means.

6. A digital adaptive equalizer circuit for correcting the frequency response of a transmission system that includes an output stage with an input digital-to-analog converter circuit for converting digital signals into analog form for transmission as analog signals, and includes a feedback circuit with an analog-to-digital converter for receiving and converting the transmitted output analog signals to digital form, said digital adaptive equalizer circuit comprising:

a first input circuit, including an input memory circuit, for receiving the input digital signals to be transmitted by the transmission system;

a second input circuit, including a feedback memory circuit, for receiving the output signals in digital form from the feedback circuit;

a first adaptive digital corrector circuit, having a variable frequency response that is varied by digital signals applied thereto, for receiving the input digital signals from said first input circuit, modifying the frequency response of the input digital signals, and for applying the modified input digital signals to the output stage for transmission;

a second adaptive digital corrector circuit, having a variable frequency response that is varied by digital signals applied thereto, for receiving output digital signals from said feedback memory circuit and modifying the frequency response of the received output digital signals;

a comparison circuit for comparing the input digital signals from said input memory circuit to the output digital signals from said second adaptive corrector circuit and applying digital difference signals to said second adaptive digital corrector circuit for controlling the degree of modification applied by said second adaptive digital corrector circuit to the received output digital signals in a direction so as to reduce the difference between the digital input signals and the digital output signals, and a control circuit applying digital signals to said first adaptive digital corrector for correcting said first adaptive corrector circuit to said second corrector circuit.

7. A digital adaptive equalizer circuit as set forth in claim 6 including a delay circuit for delaying signals so that said comparator circuit compares corresponding input digital signals and output digital signals.

8. A digital adaptive equalizer circuit as set forth in claim 6, wherein said first and second adaptive digital corrector circuits are FIR filters.

9. A digital adaptive equalizer circuit as set forth in claim 6, wherein said control circuit functions less than continuously to correlate said first adaptive corrector circuit to said second adaptive corrector circuit, and said second adaptive corrector circuit functions to continuously adapt to digital difference signals except when undergoing correlation with said first adaptive corrector circuit.

10. A digital adaptive equalizer circuit as set forth in claim 9 including:

a second comparator circuit for receiving the input digital signals from said input memory circuit and output digital signals from said feedback memory circuit and providing digital signals corresponding to the difference between the input and output digital signals;

a digital non-linear corrector circuit for receiving the input digital signals from said first memory circuit and being responsive to the digital signals from said second comparison circuit, for providing non-linear correction to the input digital signals, and the corrected digital input signals from the non-linear corrector are applied to said first adaptive digital corrector circuit.

11. A digital television broadcast transmitter comprising:

an analog power amplifier circuit;

exciter circuit for receiving digital television signals and formatting the digital television signals in form to be broadcasted by said transmitter;

a digital-to-analog converter circuit for converting the formatted digital televisions into analog form for application to said power amplifier circuit;

a feedback circuit for receiving output analog television signals from said power amplifier circuit and including a digital-to-analog converter circuit for converting the output analog television signals into digital form;

a first adaptive digital corrector circuit receiving the formatted input digital television signals, modifying the formatted input digital television signals, and applying the modified formatted input digital television signals to the digital-to-analog converter circuit, and a control circuit, including a second adaptive digital corrector circuit receiving digital output signals from said feedback circuit, a comparison circuit for comparing the formatted input digital television signals to corresponding modified output digital television signals from said second adaptive digital corrector circuit and applying digital control signals to said second adaptive digital corrector circuit for controlling the degree of modification applied to the received output digital television signals in a direction so as to reduce the difference between the formatted input digital television signals and the digital output television signals, and a circuit for correlating the modification applied by said first adaptive corrector circuit as a function of the modification applied by said second adaptive corrector circuit.

12. A digital television broadcast transmitter as set forth in claim 11, wherein said first and second adaptive digital corrector circuits are FIR filters.

13. A digital television broadcast transmitter as set forth in claim 12, wherein said control circuit functions to routinely correlate said first adaptive corrector circuit to said second adaptive corrector circuit and wherein said second adaptive corrector circuit functions to continuously adapt to digital difference signals except when undergoing correlation with said first adaptive corrector circuit.

14. A digital adaptive equalizer circuit for modifying input digital signals to be applied to a transmission system that includes an output stage and a feedback circuit for providing output signals from the output stage in digital form, said digital adaptive equalizer circuit comprising:

a first adaptive digital equalizer for receiving the input digital signals and modifying the input digital signals and applying the modified input digital signals to the output stage for transmission; and a control circuit, including a second adaptive digital equalizer receiving digital output signals from the feedback circuit, a comparison circuit for comparing the input digital signals to corresponding modified output digital signals from said second adaptive equalizer for controlling the degree of modification applied by said second adaptive equalizer to the received output digital television signals in a direction so as to reduce the difference between the input digital signals and the digital output signals, and a circuit for correlating the modification applied by said first adaptive equalizer as a function of the modification applied by said second adaptive equalizer.

15. A digital adaptive equalizer circuit as set forth in claim 14, wherein control circuit functions to routinely correlate said first adaptive equalizer to said second adaptive equalizer, and wherein said second adaptive equalizer functions to continuously adapt to digital difference signals except when undergoing correlation with said first adaptive equalizer.

16. A digital adaptive equalizer circuit as set forth in claim 15, wherein said first and second adaptive digital equalizers are FIR filters.

17. In a digital television broadcast transmitter having an input circuit for receiving digital television input signals and formatting the digital television signals in form for broadcasting, and a digital-to-analog converter for converting the formatted digital television signals into analog form for transmission by the transmitter power amplifier stage, a method for correcting distortions in the transmitter output analog television signals comprising:

receiving and converting the output analog television signals from the power amplifier stage into digital form;

offline modifying the output digital television signals;

receiving and comparing the formatted input digital television signals with the corresponding offline modified output digital television signals to control the offline modification of the output digital television signals in a direction to reduce the difference between the formatted input digital television signals and the output digital television signals;

modifying online the received formatted input digital television signals as a function of the offline modification, and applying the online modified formatted input digital television signals to the digital to analog converter.

18. A method for correction distortions as set forth in claim 17, wherein the online modification is less than continuously correlated to that of the offline modification, and the offline modification is continuous except for the correlation.

19. An adaptive apparatus for compensating a linear distorting action to an information signal within a non-ideal transmission system, the system including signal provision means for providing an information signal, and also including output means, the linear distorting action of the system including shifting of at least one aspect of the signal away from its intended value, said apparatus comprising:

compensator means, located along a signal stream of the information signal from the signal provision means to the output means, for pre-equalizing the information signal;

sampler means for coupling off a sample signal from the output means;

determination means, connected to receive the sample signal and the information signal outside of the signal steam from the signal provision means to the output means, for determining an amount of pre-equalization required from said compensator means to compensate the linear distorting action of the system; and means for modifying the pre-equalization caused by said compensator means in response to the determination by said determination means;

wherein said compensator means includes a first filter, said determination means includes a second filter, and said means for modifying includes means for convolving said second filter with said first filter.

20. An adaptive apparatus for compensating a linear distorting action to an information signal within a non-ideal transmission system, the system including signal provision means for providing an information signal, and also including output means, the linear distorting action of the system including shifting of at least one aspect of the signal away from its intended value, said apparatus comprising:

compensator means, located along a signal stream of the information signal from the signal provision means to the output means, for pre-equalizing the information signal;

sampler means for coupling off a sample signal from the output means;

determination means, connected to receive the sample signal and the information signal outside of the signal steam from the signal provision means to the output means, for determining an amount of pre-equalization required from said compensator means to compensate the linear distorting action of the system; and means for modifying the pre-equalization caused by said compensator means in response to the determination by said determination means;

wherein the signal provision means includes means for providing the information signal in complex format, said apparatus further including first complex-to-real conversion means for converting the information signal provided to said compensator means, and second complex-to-real conversion means for converting the information signal provided to said determination means.

21. An adaptive apparatus for compensating a linear distorting action to an information signal within a non-ideal transmission system, the system including signal provision means for providing an information signal, and also including output means, the linear distorting action of the system including shifting of at least one aspect of the signal away from its intended value, said apparatus comprising:

compensator means, located along a signal stream of the information signal from the signal provision means to the output means, for pre-equalizing the information signal;

sampler means for coupling off a sample signal from the output means;

determination means, connected to receive the sample signal and the information signal outside of the signal steam from the signal provision means to the output means, for determining an amount of pre-equalization required from said compensator means to compensate the linear distorting action of the system; and means for modifying the pre-equalization caused by said compensator means in response to the determination by said determination means;

wherein the system further includes non-linear corrector means for correcting non-linear effects of the transmission system, the non-linear corrector means being located along the signal steam from the signal provision means to the output means, and means for utilizing the sample signal to determine a non-linear correction for the non-linear corrector means.

* * * * *